United States Patent [19]

Aufderheide

[11] Patent Number: 4,714,631

[45] Date of Patent: Dec. 22, 1987

[54] RAPIDLY REMOVABLE UNDERCOATING FOR VACUUM DEPOSITION OF PATTERNED LAYERS ONTO SUBSTRATES

[75] Inventor: Brian E. Aufderheide, Cedarburg, Wis.

[73] Assignee: W. H. Brady Co., Milwaukee, Wis.

[21] Appl. No.: 912,650

[22] Filed: Sep. 29, 1986

Related U.S. Application Data

[63] Continuation of Ser. No. 770,338, Aug. 28, 1985, abandoned.

[51] Int. Cl.$^4$ .............................................. C23C 16/00
[52] U.S. Cl. .............................. 427/250; 204/192.14; 204/192.15; 427/272; 428/199; 428/461
[58] Field of Search ...................... 427/250, 255, 272; 428/199, 461; 204/192.14, 192.15

[56] References Cited

U.S. PATENT DOCUMENTS

| | | | |
|---|---|---|---|
| 3,374,195 | 3/1968 | Bianco | 524/376 |
| 3,886,112 | 5/1975 | Watson | 524/388 |
| 3,991,230 | 11/1976 | Dickie | 427/250 |
| 4,005,238 | 1/1977 | Gaehde | 427/250 |
| 4,014,845 | 3/1977 | Grier | 524/388 |
| 4,015,049 | 3/1977 | Yoda | 428/461 |
| 4,119,604 | 10/1978 | Wysong | 524/377 |
| 4,206,101 | 6/1980 | Wysong | 524/377 |
| 4,464,416 | 8/1984 | Liepins | 427/250 |
| 4,481,326 | 11/1984 | Sonenstein | 524/377 |
| 4,521,482 | 6/1985 | Arai | 427/250 |
| 4,542,178 | 9/1985 | Zimmermann | 524/387 |
| 4,543,370 | 9/1985 | Porter | 523/105 |

Primary Examiner—Paul R. Michl
Attorney, Agent, or Firm—Quarles & Brady

[57] ABSTRACT

An undercoating for the vacuum deposition of material thereover that can be removed from a substrate by washing with water for one minute or less comprising a water soluble film-forming polymers, a solubility accelerator and a solid particulate material that provides a rough surface topology to the undercoating when dried.

10 Claims, 8 Drawing Figures

RAPIDLY REMOVABLE UNDERCOATING FOR VACUUM DEPOSITION OF PATTERNED LAYERS ONTO SUBSTRATES

This application is a continuation of application Ser. No. 770,338 filed Aug. 28, 1985 abandoned.

TECHNICAL FIELD

This invention relates to novel undercoatings useful in forming a patterned layer on a surface of a substrate by vacuum deposition techniques.

BACKGROUND ART

Various types of manufactured articles are or can be made by the vacuum deposition of a material, for example, aluminum, onto a substrate in which the material is to be formed as a patterned layer on the substrate. A nameplate is one example of this type of article, which can have a plastic film substrate and a metallized layer on a surface thereof which is patterned to provide alphanumeric informational graphics or a decorative design. The nameplate may be applied to an object, such as by adhesive, for identification purposes; also, the same type of construction can be used as a faceplate for a switch or keyboard with the alphanumeric graphics used to denote specific switch sites. Another example of this general type of article is a membrane switch, including at least two layers of plastic film spaced from one another with conductive patterns on the two facing surfaces of the films. The conductive patterns will include one or more switch sites with a conductive lead extending from each site onto a tail panel for connnection to external drive and sense circuits. The conductive patterns can be formed on the films by vacuum deposition techniques.

Vacuum deposition, which is well known, is the process of applying a material onto a substrate in a vacuum chamber by evacuating the chamber to the desired pressure by means of vacuum pumps and evaporating or sputtering a supply of the material within the chamber so as to coat the substrate. Metals that can be applied by vacuum deposition include aluminum, titanium, vanadium, chromium, nickel, copper, zirconium, niobium, molybdenum, palladium, silver, tin, tantalum, tungsten and gold. Compounds can also be applied by vacuum deposition, such as titanium nitride, tantalum nitride, silicon dioxide, aluminum oxide and Teflon (Reg. T.M.), by the sputtering technique. The vacuum in the chamber is normally in the range of $1 \times 10^{-4}$ torr when employing evaporation of the material, 1 to $4 \times 10^{-3}$ torr for magnetron sputtering and a lower pressure when using ion beam sputtering. The thickness of the layer of material formed on the substrate can vary widely, but vacuum deposition is most often used to apply thin layers up to about 0.0025 mm thick.

The vacuum deposition of a layer that completely covers a surface of the substrate is a relatively simple technique. However, when the layer is to be in the form of a pattern in which some parts of the surface of the substrate are to be covered and other parts are not to be covered, more difficult methods are required.

Several techniques are well known in the art for forming a patterned metallized layer on a substrate. The photoresist system is one such technique in which the entire surface of the substrate is metallized, a photoresist coating is applied over the metal layer, a photographic negative of the desired pattern is placed on top of the photoresist coating and exposed to light so as to polymerize parts of the coating, after which unexposed parts of the photoresist coating are washed away. The metal layer is removed from areas uncovered by washing away the unexposed photoresist coating by wet etching techniques using acidic or basic solutions or dry etching techniques using gas in the form of a plasma or excited by a photon beam (see Fonash, "Advances in Dry Etching", *Solid State Technology*, January 1985, pp. 150–158). The exposed photoresist coating is then removed with solvents to provide a metallized pattern on the substrate. The photoresist technique can be practiced in either the "negative" form in which the photoresist coating is exposed in parts that are not to be metallized in the final pattern, as described, or in the "positive" form in which the photoresist coating is exposed in the parts that are to be metallized. Another technique is the mask system in which a mask having cut-out portions defining parts of the substrate to be metallized is applied to the substrate. Metal is then vacuum deposited onto the substrate only in the cutout portions of the mask, leaving the remainder of the substrate surface free of metal. All of these methods are well known in the art and are described, for example, in *Handbook of Thin Film Technology*, Maissel & Glang, published by McGrawHill Book Company, 1970.

The foregoing methods have a number of disadvantages. Photoresist methods are multi-step processes which are timeconsuming; some use corrosive, hazardous materials that require safety precautions in their use and present disposal problems; substrate materials can be damaged during processing; and solvents used to remove materials can remove inks printed on the substrate. Mask systems require the use of costly masks, particularly with complicated patterns; it is difficult to obtain accurate registration between the mask and the substrate and also to obtain good contact between the mask and the substrate, which can cause shadowing; the dimensional expansion of metal masks when heated poses a problem; metal masks become heated during vacuum deposition and can melt plastic substrates; and it is difficult to make a mask that will provide a pattern with fine detail and resolution and get reliable transfer of the pattern to the substrate.

Another system for forming a patterned metallized layer on the substrate is described in U.S. Pat. No. 3,935,334. The process disclosed by this patent involves coating the substrate with a water-soluble paint that consists of a water-soluble polymer. Numerous polymers are said to be suitable, including polyvinyl alcohol, some cellulose polymers, polyvinyl pyrrolidone, polyacrylic ester polymers, etc. The process involves first coating the substrate layer with the water-soluble polymer in the desired pattern, vacuum depositing metal over the coated substrate, and then washing the substrate with water to remove the polymer coating and any metal deposited thereon. However, I have noted two problems with the process as described by this patent. First, coatings of water-soluble polymers described as being useful in the patent take such a long time to remove by the final water washing step as to make the process of little or no utility for production purposes, particularly production techniques which must be run at a relatively high speed in order to be economically feasible. The polymers have a slow dissolving rate and it is difficult to penetrate the metal layer over the polymer coating. Secondly, only a very thin layer of the water-soluble polymer can be applied to the substrate, which the patent states is preferably only about 0.003 mm thick or less. Apparently the thickness of the water-soluble layer is limited because the slow rate at which the polymer is dissolved limits the process speed.

The deficiencies of the prior art processes as described above provided the impetus for the research work that led to the development of the present invention. One of the main objects of this invention was to develop undercoatings that could be rapidly removed after the vacuum deposition of material over the coatings. A more specific object was to develop coatings based on water-soluble polymers but including other ingredients that would speed up the removal of the coatings when washing with water. Another specific object was to develop processes for vacuum metallization of substrates that involve the use of the new coatings described hereinafter.

DISCLOSURE OF INVENTION

My present invention provides an undercoating that can be deposited onto a surface of a substrate in a selected pattern, which coating comprises a combination of (1) a water soluble film-forming polymer, (2) a low molecular weight solubility accelerator compound that acts to increase the rate of water solubility of the coating, and (3) a solid particulate that creates a rough surface topology of the coating. Material is then applied by vacuum deposition over a substrate carrying a patterned undercoating of the foregoing composition, after which the undercoating is washed away with water so as to remove material adhering to the undercoating and provide a substrate on which the vacuum deposited layer has the selected pattern. As will be demonstrated by the experimental data set forth hereinafter, the undercoatings of the present invention can be washed away very quickly so as to be rapidly removable, by which is meant one minute or less. The present coatings thereby enable vacuum deposition of patterned layers in a process which can be run at higher speed than the prior art processes because of the rapidly removable coatings provided by this invention.

DESCRIPTION OF THE DRAWINGS

The present invention is described in sufficient detail to enable those skilled in this art to practice the same, by reference to the following drawings in which.

DETAILED DESCRIPTION

(a) FIGS. 1-5

Figure 1:
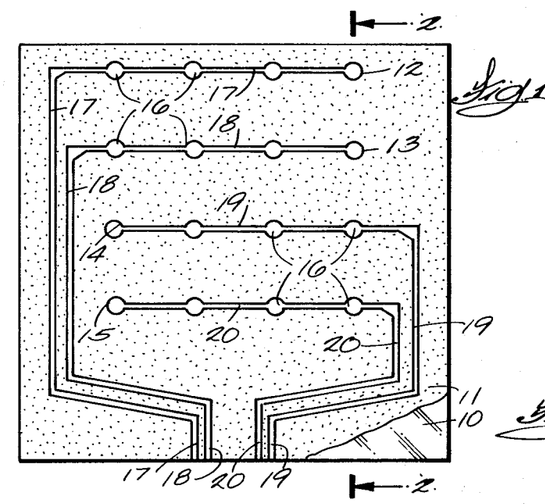
FIG. 1 is a plan view of a substrate film, illustrated as a film layer of a membrane switch, having an undercoating of the present invention on a surface thereof with a portion of the undercoating broken away.

FIG. 1 illustrates a substrate 10 comprising a sheet of plastic film on which a conductive pattern is to be applied by vacuum deposition of a metal to produce a film layer of a membrane switch. An undercoating 11 of the present invention is coated onto a surface of the substrate, such as by screen printing. The undercoating is applied to a substrate in a pattern comprising coated areas and uncoated areas, the coated areas being denoted by stippling in FIG. 1 for clarity of illustration. There is undercoating in the areas that are stippled, but there is no undercoating in the clear areas in FIG. 1 that comprise rows 12, 13, 14 and 15 of circular apertures 16, a rectilinear track area 17 connecting together the apertures 16 in row 12, a rectilinear track area 18 connecting together the apertures 16 in row 13, a rectilinear track area 19 connecting together the apertures 16 in row 14, and a rectilinear track area 20 connecting together the apertures 16 in row 15. The rectilinear track areas 17-20 extend along the side of the substrate 10 and terminate at an end thereof, tracks 17 and 18 being on the left side of the substrate and tracks 19 and 20 on the right side as viewed in FIG. 1.

Figures 2, 3:
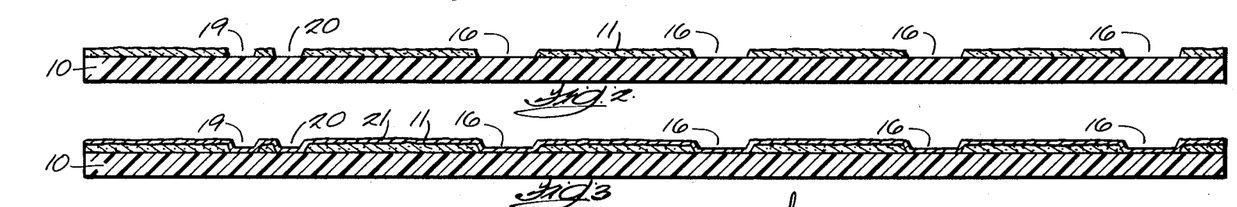
FIG. 2 is a sectional view of the coated substrate of FIG. 1 taken along the plane of line 2—2 thereof.
FIG. 3 is a sectional view along the same plane as FIG. 2 illustrating the coated substrate after vacuum deposition of a layer of material over the surface of the substrate, including the undercoating.

FIG. 2 shows the substrate 10 and undercoating 11 in cross section and further illustrates the manner in which the undercoating is applied to provide coated and uncoated portions of the substrate. One of the novel features of the rapidly removable undercoatings of this invention is their rough surface topology, which is illustrated in FIG. 2, bearing in mind that the thickness of the undercoating layer has been exaggerated for clarity of description. The undercoating 11 will generally be in the range of about 0.005 to 0.125 mm thick. The topology of the undercoating is a result of the unique compositions which are described in detail in part (c) below.

After the undercoating 11 has dried, which can be done in a hot air oven such as, for example air at 180° F. in a forced air tunnel, the substrate 10 is placed in a vacuum chamber and the appropriate material is applied as a layer covering the surface of the substrate on which the patterned undercoating has been formed. In the exemplary article of FIG. 1, a conductive metal such as aluminum or silver is vacuum deposited over the surface of the substrate so as to form a conductive pattern on the substrate after processing has been completed. FIG. 3 illustrates the substrate 10 with a metal layer 21 vacuum deposited over the surface of the substrate so as to adhere to the undercoating 11 thereon and to adhere to the uncoated portions of the substrate.

Following vacuum deposition of layer 21, the next step in a manufacturing process with the undercoatings of this invention is to wash the undercoating and any vacuum deposited material adhering thereto off the surface of the substrate. This is accomplished by washing the substrate with water in any suitable fashion. A useful method is to spray the substrate with warm (140° F.) water with gentle brushing to completely remove the undercoating and any vacuum deposited material adhering to the undercoating.

Figure 4:
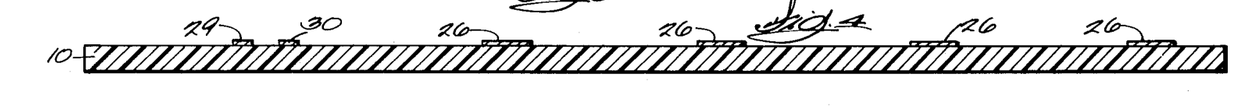
FIG. 4 is a sectional view along the same plane as FIGS. 2 and 3 illustrating the substrate film after the undercoating and vacuum deposited material adhering thereto has been washed away to thereby provide a pattern of the vacuum deposited material on the substrate.
Figure 5:
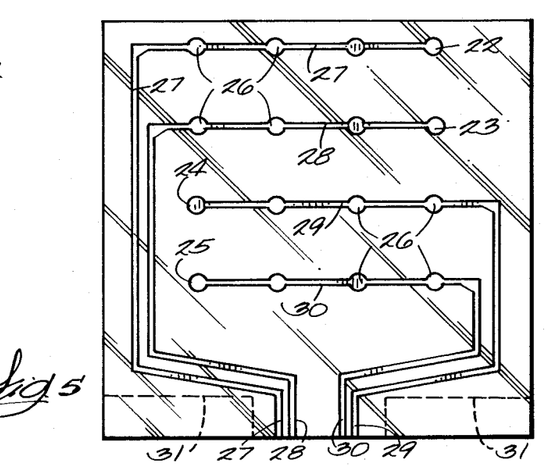
FIG. 5 is a plan view of the substrate of FIG. 1 after the undercoating has been washed away.

FIGS. 4 and 5 illustrate, in cross-section and plan view respectively, substrate 10 after the undercoating 11 and layer 21 adhering thereto has been washed off the substrate. A conductive pattern has now been formed on the surface of the substrate in the areas that had not been covered with undercoating, the pattern consisting of rows 22, 23, 24 and 25 of conductive pads 26 and conductive tracks 27, 28, 29 and 30 interconnecting, respectively, the conductive pads of rows 22, 23, 24 and 25. The conductive pads 26 have been formed within the apertures 16 of the undercoating 11 and the conductive tracks 27-30 have been formed, respectively, within the rectilinear track areas 17-20 of the undercoating. The substrate may be cut along the dashed lines 31 as shown in FIG. 5 to provide a tail portion at the end of the part of the substrate carrying the conductive pads so that the conductive tracks can be connected to external electrical circuitry. The substrate 10 together with a second sheet having a mating conductive pattern formed as described above can be combined in a membrane switch as the two contact-carrying panels to form a 4×4 switch matrix.

Figure 6:
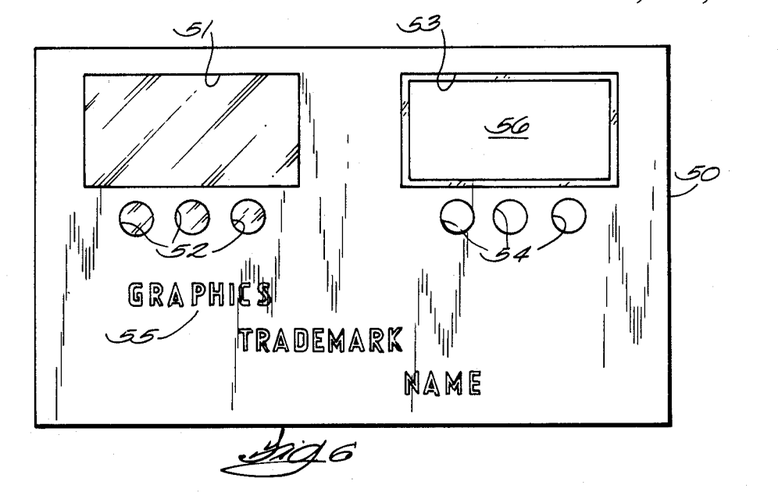
FIG. 6 is a front plan view of a second article, a nameplate, prior to coating with an undercoating of the present invention.
Figure 7:
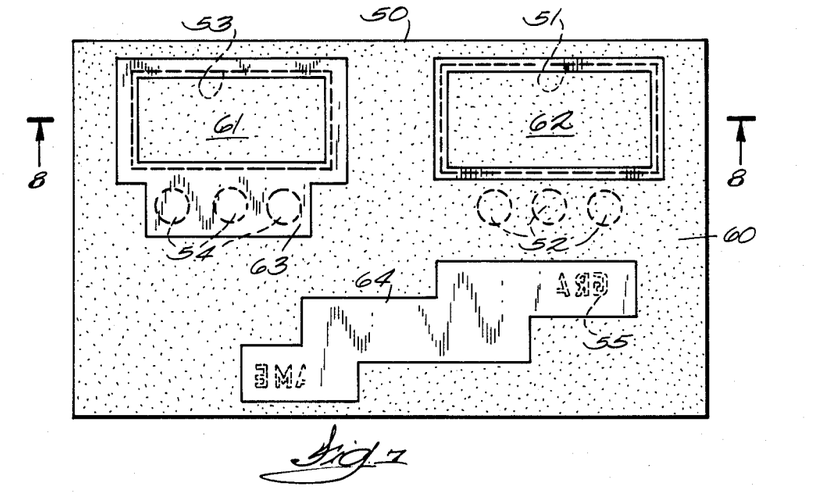
FIG. 7 is a rear plan view of the article of FIG. 6 showing portions thereof covered by an undercoating of this invention prior to vacuum deposition.
Figure 8:
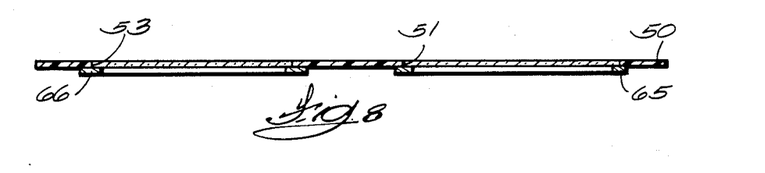
FIG. 8 is a sectional view along the plane of line 8—8 of FIG. 7 illustrating the nameplate after the undercoating and any vacuum deposited material adhering thereto have been washed away.

(b) FIGS. 6–8

FIGS. 6 and 7 illustrate a nameplate 50 to be made by use of the undercoatings of this invention. The nameplate comprises a sheet of plastic film having black ink printed in a pattern on its rear surface defining, viewed from the front as shown in FIG. 6, a clear window 51 with three clear circles 52 underneath the window, a clear window 53 with three clear circles 54 underneath it, and alphanumeric graphics 55 depicted as clear letters across the bottom of the nameplate. A rectangular block 56 of red ink is printed inside the window 53 on the back surface of the nameplate.

Turning to FIG. 7 illustrating the back of the nameplate 50, an undercoating of this invention is applied in a pattern over the back surface which, as depicted by the stippling, includes a major portion 60 over most of the back, a rectangular block 61 of undercoating within and spaced from window 53 that overlies the block 56 of red ink and a rectangular block 62 of undercoating within and spaced from window 51. Block 61 and/or block 62 can be patterned to have an uncoated portion that will define a word in either or both of the windows. A small rectangular area 63 around the circles 54 and an irregular area 64 around the graphics 55 are left uncoated with undercoating. The major portion 60 of undercoating is spaced from the blocks 61 and 62 around the windows 51 and 53.

After the undercoating is dried, the back surface of the nameplate 50 is metallized by vacuum deposition, such as with aluminum, and the undercoating and metal adhering to the undercoating are washed away as previously described. The finished nameplate will have metallized areas in the uncoated spaces between the blocks 61 and 62 and the major portion 60, inside the rectangular area 63, and inside the rectangular area 64. These metallized portions will be visible from the front of the nameplate through the graphics 55 and the circles 54. Also, the metallized layer will be visible as a frame 65 surrounding window 51 and a frame 66 surrounding window 53 as shown in the cross-sectional view of FIG. 8.

An important feature of the undercoatings of this invention is that they can be applied over printing inks, metallized and then washed away with water without damaging the inks. This feature makes the undercoatings particularly useful in the manufacture of nameplates and similar articles that require printed graphics or patterns combined with metallized portions.

(c) Undercoating Compositions

The rapidly removable undercoatings of the present invention are formulated as a combination of three essential ingredients: (1) a water-soluble film-forming polymer, (2) a solubility accelerator, and (3) solid particulates that are insoluble in the film-former. As previously discussed, the undercoatings are to be removable within one minute or less when washed with water after material has been vacuum deposited over the undercoatings to qualify as "rapidly removable".

The term "Water Solubility Rate" as used in this description and in the claims is defined to mean the elapsed time required for a sample of material to dissolve completely when tested by the following procedure. 0.5 gm of sample is added to a 5 ml vial, 3 ml of water is added and the vial is capped. The time required for the sample to dissolve completely in the water is recorded, with the vial shaken periodically during such time. The elapsed time for complete dissolution of the sample is the Water Solubility Rate.

The first essential ingredient of the present undercoatings is a water soluble film-forming polymer. Suitable polymers generally will have an average molecular weight (AMW) of at least 2,000, usually in the range of 2,000 to 400,000. The film-forming polymer provides the coating matrix within which the other two essential ingredients are carried. Although polymers of this type are water soluble, they dissolve too slowly to provide a rapidly removable undercoating when used by themselves as is demonstrated by comparative Examples 1 and 2. Suitable water soluble polymers usually have a Water Solubility Rate in the range of 1 to 10 hours, and generally the most useful water soluble polymers have a Water Solubility Rate of 4 to 8 hours. Specific polymers illustrated in the Examples include polyvinyl alcohol (AMW of 3,000), poly (acrylic acid) (AMW of 90,000 or greater) and polyvinyl pyrollidone (AMW of 40,000 or 360,000).

The second essential ingredient of the rapidly removable undercoatings of this invention is a solubility accelerator consisting of a water soluble compound that is also compatible with the film-forming polymer and acts to speed up the rate of dissolution of a coating made with the polymer. The solubility accelerator dissolves in water much more rapidly than the polymer and useful compounds are those that have a Water Solubility Rate of 30 minutes or less. Compounds suitable as a solubility accelerator will generally have an average molecular weight of about 1000 or less. Specific compounds useful as a solubility accelerator in combination with the film-forming polymer include sugars, e.g. sucrose, dextrose and fructose; salts, e.g. sodium acetate, sodium bromide, sodium carbonate, sodium chloride, sodium iodide, sodium sulfate, potassium bromide, potassium chloride, magnesium bromide, ammonium carbonate and lithium chloride; organic acids, e.g. citric acid, tartaric acid and toluene sulfonic acid; and organic alcohols, e.g. glycerol, sorbitol and tetraethylene glycol. It is believed, although I do not wish to be bound by any theory, that the solubility accelerators are dissolved or finely dispersed in the film-forming polymer of the coatings and act, during water washing of the coatings, to quickly dissolve from around the polymer chains and thereby increase the solubility rate of the undercoatings.

The third essential ingredient of the present undercoatings is a solid particulate material that is insoluble in the film-forming polymer and thereby provides the dried undercoatings with an irregular or rough surface topology. This feature of the present undercoatings is depicted by the irregular surface of the undercoating 11 in FIGS. 2 and 3. The uneven surface topology of the dried undercoatings is believed to aid water solubility by two mechanisms. The undercoatings have increased surface area which acts to speed up the water washing of the undercoatings. Secondly, a layer of material vacuum deposited over the rough surface of the undercoatings will have numerous defects in areas occluded or shadowed by the surface particles during deposition; this also speeds water washing because the water can penetrate through the defects and thereby more quickly dissolve the undercoating under the vacuum deposited layer. Specific solid particulates include aluminum powder, carbon black, silica, sodium potassium aluminum silicate, fine glass beads and $TiO_2$ coated mica. The solid particulate preferably has a very small particle size since the undercoatings are often applied as a thin layer, but solids with a particle size up to 300 mesh have proved useful.

Other ingredients may optionally be included in the undercoatings in small amounts for specific purposes, such as defoamers, plasticizers or organic solvents to enhance printability. In the Examples which follow, percentages are on a weight basis unless otherwise noted, and compounds identified by a tradename or Registered Trademark are marked with an asterisk following the name.

Experimental Procedure. Each of the coatings of Examples 1–22 were applied to a substrate test film consisting of polyester film at a wet thickness of about 0.125 mm, dried, covered with a layer of silver, aluminum or other materials by vacuum deposition, and washed with cold running water. Silver was applied as a layer about 0.00015 mm thick by sputtering in a vacuum chamber. Aluminum was applied as a layer about 0.0001 mm thick by thermal evaporation in a vacuum chamber in Examples 1–6 and 18–21 and by sputtering in a vacuum chamber in Examples 7–17 and 22. The water soluble film-forming polymers used in the compositions of the following Examples were (1) polyvinyl alcohol with an average molecular weight of 3000, Gelvatol 40-20*, identified in the Examples as PVA; (2) poly (acrylic acid) with an average molecular weight of 90,000 or greater, identified in the Examples as PAA, and (3) polyvinyl pyrollidone with an average molecular weight of 40,000 or 360,000, identified in the Examples as PVP.

COMPARATIVE EXAMPLE 1

A coating of the following composition was applied to a test film.

| Water soluble film-forming polymer PVA | 36 gms |
| Deionized water | 64 gms |

COMPARATIVE EXAMPLE 2

A coating of the following composition was applied to a test film.

| Water soluble film-forming polymer PAA | 25 gms |
| Deionized water | 75 gms |

COMPARATIVE EXAMPLE 3

A coating of the following composition was applied to a test film.

| Water soluble film-forming polymer PVA | 36 gms |
| Solubility accelerator Dextrose | 36 gms |
| Deionized water | 84 gms |

COMPARATIVE EXAMPLE 4

A coating of the following composition was applied to a test film.

| Water soluble film-forming polymer PAA | 30 gms |
| Solubility accelerator Dextrose | 30 gms |
| Deionized water | 90 gms |

COMPARATIVE EXAMPLE 5

A coating of the following formulation was applied to a test film.

| Water soluble film-forming polymer PVA | 18 gms |
| Solid particulate Silica (Lovel 28*) | 5 gms |
| Deionized water | 42 gms |

Using the techniques of the Experimental Procedure, the undercoatings of Comparative Examples 1–5 were covered with silver by vacuum deposition and the time to wash the undercoatings and silver adhering thereto off the substrate film was measured. The results for water removal of the undercoatings when covered with a vacuum deposited silver layer are set forth in Table 1.

TABLE 1

| | Water Removal Rate |
| --- | --- |
| | After Silver Deposition |
| Comparative Example 1 | 5% removed in 4 minutes |
| Comparative Example 2 | 10% removed in 4 minutes |
| Comparative Example 3 | 30% removed in 4 minutes |
| Comparative Example 4 | 65% removed in 4 minutes |
| Comparative Example 5 | 90% removed in 4 minutes |

The Experimental Procedure was followed to determine the water removal rate of the undercoatings of Comparative Examples 1–5 after aluminum was vacuum deposited over the undercoatings, and the results are recorded in Table 2.

TABLE 2

| | Water Removal Rate After Aluminum Deposition |
|---|---|
| Comparative Example 1 | 20-25% removed in 4 minutes |
| Comparative Example 2 | 98% removed in 2½ minutes |
| Comparative Example 3 | 100% removed in 2 minutes |
| Comparative Example 4 | 98% removed in 2 minutes |
| Comparative Example 5 | 90% removed in 3 minutes |

The data of Tables 1 and 2 illustrate that undercoatings containing only the water soluble film-forming polymer do not provide a rapidly removable undercoating (Examples 1 and 2), that the combination of the polymer and a solubility accelerator speeds up water removal but still does not provide a rapidly removable undercoating (Examples 3 and 4), and that the combination of the polymer and solid particulates also speeds up water removal but does not provide a rapidly removable undercoating (Example 5).

Examples 6-22 present rapidly removable undercoatings according to the present invention. The formulation of each Example includes the weight of each component of the coating and also include a column setting forth the percentage (rounded off to the nearest whole number) by weight of the total weight of the three essential ingredients of the coatings, namely, the polymer, the solubility accelerator and the solid particulate.

EXAMPLE 6

An undercoating of the following formulation was applied to a test film.

| | | |
|---|---|---|
| Water soluble film-forming polymer PVA | 70 gms | 39% |
| Solubility accelerator Dextrose | 70 gms | 39% |
| Solid particulate Silica (Lovel 28*) | 40 gms | 22% |
| Deionized water | 210 gms | |
| Solvent Dipropylene glycol monoethyl ether | 150 gms | |

EXAMPLE 7

An undercoating of the following formulation was applied to a test film.

| | | |
|---|---|---|
| Water soluble film-forming polymer PVA | 7.4 gms | 43% |
| Solubility accelerator Potassium bromide | 5.8 gms | 34% |
| Solid particulate Silica powder (Syloid 620*) | 4.0 gms | 23% |
| Deionized water | 23.1 gms | |

EXAMPLE 8

An undercoating of the following formulation was applied to a test film.

| | | |
|---|---|---|
| Water soluble film-forming polymer PVA | 5.4 gms | 44% |
| Solubility accelerator glycerol | 3.0 gms | 24% |
| Solid particulate Silica powder (Lovel 28*) | 4.0 gms | 32% |
| Deionized water | 17.6 gms | |

EXAMPLE 9

An undercoating of the following formulation was applied to a test film.

| | | |
|---|---|---|
| Water soluble film-forming polymer PVA | 5.4 gms | 40% |
| Solubility accelerator l-Tartaric Acid | 5.0 gms | 37% |
| Solid particulate Silica powder (Lovel 28*) | 3.0 gms | 23% |
| Deionized water | 14.4 gms | |

EXAMPLE 10

An undercoating of the following formulation was applied to a test film.

| | | |
|---|---|---|
| Water soluble film-forming polymer PAA, 90,000 AMW | 3.5 gms | 28% |
| Solubility accelerator Citric acid | 5.0 gms | 40% |
| Solid particulate Sodium potassium aluminum silicate powder (Perlite) | 4.0 gms | 32% |
| Deionized water | 21.0 gms | |

EXAMPLE 11

An undercoating of the following formula was applied to a test film.

| | | |
|---|---|---|
| Water soluble film-forming polymer PAA, 90,000 AMW | 3.5 gms | 37% |
| Solubility accelerator Tetraethylene glycol | 2.0 gms | 21% |
| Solid particulate Silica powder (Lovel 28*) | 4.0 gms | 42% |
| Deionized water | 18.0 gms | |

EXAMPLE 12

An undercoating of the following formulation was applied to a test film.

| | | |
|---|---|---|
| Water soluble film-forming polymer PAA, AMW greater than 90,000 | 3.5 gms | 32% |
| Solubility accelerator Sorbitol | 3.5 gms | 32% |
| Solid particulate Silica powder (Lovel 28*) | 4.0 gms | 36% |
| Deionized water | 45.0 gms | |

EXAMPLE 13

An undercoating of the following formulation was applied to a test film.

| | | |
|---|---|---|
| Water soluble film-forming polymer PAA, 90,000 AMW | 3.5 gms | 32% |
| Solubility accelerator Fructose | 3.5 gms | 32% |
| Solid particulate Silica powder (Lovel 28*) | 4.0 gms | 36% |

EXAMPLE 14

An undercoating of the following formulation was applied to a test film.

| | | |
|---|---|---|
| Water soluble film-forming polymer PVP, 360,000 AMW | 7.4 gms | 40% |
| Solubility accelerator Potassium chloride | 7.0 gms | 38% |
| Solid particulate Silica powder (Lovel 28*) | 4.0 gms | 22% |
| Deionized water | 50.0 gms | |

EXAMPLE 15

An undercoating of the following formulation was applied to a test film.

| | | |
|---|---|---|
| Water soluble film-forming polymer PVP, 360,000 AMW | 7.4 gms | 35% |
| Solubility accelerator l-tartaric acid | 8.0 gms | 37% |
| Solid particulate Sodium potassium aluminum silicate (Perlite) | 6.0 gms | 28% |
| Deionized water | 50.0 gms | |

EXAMPLE 16

An undercoating of the following formulation was applied to a test film.

| | | |
|---|---|---|
| Water soluble film-forming polymer PVP, 360,000 AMW | 5.0 gms | 31% |
| Solubility accelerator Sucrose | 7.0 gms | 44% |
| Solid particulate Sodium potassium aluminum Silicate (Perlite) | 4.0 gms | 25% |
| Deionized water | 25.0 gms | |

EXAMPLE 17

An undercoating of the following formulation was applied to a test film.

| | | |
|---|---|---|
| Water soluble film-forming polymer PVP, 40,000 AMW | 5.0 gms | 48% |
| Solubility accelerator Tetraethylene glycol | 2.5 gms | 24% |
| Solid particulate Sodium potassium aluminum Silicate (Perlite) | 3.0 gms | 28% |
| Deionized water | 10.0 gms | |

Using the techniques of the Experimental Procedure, a silver layer was vacuum deposited over the undercoatings of Examples 6–17 and the time to wash the undercoatings and silver adhering thereto off the substrate was measured. The results for the water removal rate of the undercoatings of this invention when covered with a vacuum deposited silver layer are set forth in Table 3.

-continued

| | |
|---|---|
| Deionized water | 21.5 gms |

TABLE 3

| | Water Removal Rate |
|---|---|
| | After Silver Deposition |
| Example 6 | 100% removed in 10 seconds |
| Example 7 | 100% removed in 15 seconds |
| Example 8 | 100% removed in 14 seconds |
| Example 9 | 100% removed in 5 seconds |
| Example 10 | 100% removed in 8 seconds |
| Example 11 | 100% removed in 11 seconds |
| Example 12 | 100% removed in 6 seconds |
| Example 13 | 100% removed in 6 seconds |
| Example 14 | 100% removed in 5 seconds |
| Example 15 | 100% removed in 25 seconds |
| Example 16 | 100% removed in 35 seconds |
| Example 17 | 100% removed in 6 seconds |

Comparison of the data of Table 3 with that of Table 1 will demonstrate the substantial increase in the water removability rate of an undercoating of the present invention when covered with a vacuum deposited silver layer. As noted in Table 3, there was 100% removal of the undercoating and silver adhering thereto in a very short time ranging from 5 seconds to 35 seconds. In contrast, none of the undercoatings of comparative Examples 1–5 achieved complete removal of the undercoating and vacuum deposited silver adhering thereto by water washing for as long as four minutes. The undercoatings of Examples 6–17 thus provide rapidly removable undercoatings as defined in this specification.

The undercoatings of Examples 6–17 were also covered with vacuum deposited aluminum and the water removable rate of the undercoatings so coated was measured, again employing the techniques of the experimental procedure. The results of this testing are presented in Table 4.

TABLE 4

| | Water Removal Rate |
|---|---|
| | After Aluminum Deposition |
| Example 6 | 100% removed in 6 seconds |
| Example 7 | 100% removed in 10 seconds |
| Example 8 | 100% removed in 7 seconds |
| Example 9 | 100% removed in 7 seconds |
| Example 10 | 100% removed in 7 seconds |
| Example 11 | 100% removed in 18 seconds |
| Example 12 | 100% removed in 7 seconds |
| Example 13 | 100% removed in 9 seconds |
| Example 14 | 100% removed in 6 seconds |
| Example 15 | 100% removed in 21 seconds |
| Example 16 | 100% removed in 25 seconds |
| Example 17 | 100% removed in 9 seconds |

The data of Table 4 also demonstrate the utility of the undercoatings of this invention, Examples 6–17, as providing a rapidly removable undercoating when covered with a vacuum deposited aluminum layer. There is a significantly increased rate of water removal as compared to the undercoatings of Comparative Examples 1–5, see Table 2, with the undercoatings of this invention having water removal rates generally in the range of 5 to 40 times as fast as those of Examples 1–5 and providing 100% removal in all instances.

Examples 18 and 19 present formulations for undercoatings of this invention similar to that of Example 6 but using two different solid particulates, and Example 20 is a formulation similar to Example 10 with a different solid particulate.

EXAMPLE 18

An undercoating of the following formulation was applied to the test film.

| | | |
|---|---|---|
| Water soluble film-forming polymer PVA | 4.7 gms | 38% |
| Solubility accelerator Dextrose | 4.8 gms | 38% |
| Solid particulate Carbon black (Vulcan XC-72R*) | 3.0 gms | 24% |
| Deionized water | 18.0 gms | |
| Defoamer Byk 020* | 0.1 gm | |

EXAMPLE 19

An undercoating of the following formulation was applied to a test film.

| | | |
|---|---|---|
| Water soluble film-forming polymer PVA | 4.7 gms | 35% |
| Solubility accelerator Dextrose | 4.8 gms | 35% |
| Solid particulate Aluminum powder | 4.0 gms | 30% |
| Deionized water | 18.0 gms | |
| Defoamer Byk 020* | 0.1 gms | |

EXAMPLE 20

An undercoating of the following formulation was applied to a test film.

| | | |
|---|---|---|
| Water soluble film-forming polymer PAA | 3.5 gms | 28% |
| Solubility accelerator Citric acid | 5.0 gms | 40% |
| Solid particulate Fine glass beads | 4.0 gms | 32% |
| Deionized water | 11.5 gms | |

When tested for the water removal rate of a vacuum deposited aluminum layer in accordance with the Experimental Procedure, the undercoatings of Examples 18, 19 and 20 were 100% removable in 5 seconds, 25 seconds and 60 seconds, respectively.

Two or more solubility accelerator compounds and/or two or more solid particulates can be included in an undercoating of this invention, as shown by the following Example 21.

EXAMPLE 21

An undercoating of the following formulation was applied to a test film.

| | | |
|---|---|---|
| Water soluble film-forming polymer PVP | 3.0 gms | 34% |
| Solubility accelerator | | |
| Dextrose | 2.0 gms | 22% |
| Tetraethylene glycol | 1.0 gms | 11% |
| Solid particulate | | |
| Silica (Lovel 27*) | 2.0 gms | 22% |
| Silica (Syloid 620*) | 1.0 gms | 11% |
| Deionized water | 6.0 gms | |

The undercoating of Example 21 when covered with a vacuum deposited aluminum layer was 100% removed in 6 seconds and when covered with a vacuum deposited silver layer was 100% removed in 6 seconds, all when tested as specified in the Experimental Procedure.

EXAMPLE 22

Numerous other materials were vacuum deposited over the undercoating of Example 6 and tested for water removability as specified in the Experimental Procedure. The materials tested in this fashion and the thickness at which they were vacuum deposited were as follows:

(1) Titanium, chromium, nickel, copper, zirconium, niobium, molybdenum, palladium, tin, tantalum, tungsten, gold, indium, titanium nitride and tantalum nitride. Layers of these materials were vacuum deposited onto the undercoating in thicknesses of 0.00005 mm and 0.0001 mm by sputtering in a vacuum chamber.

(2) Aluminum oxide and indium tin oxide were applied in a layer 0.0002 mm thick onto the undercoating by sputtering in a vacuum chamber. When washed with water, the undercoating of this Example and each of the above vacuum deposited materials adhering thereto was completely washed off the substrate test film at various times, all less than 25 seconds.

In the foregoing examples, the film-forming polymers had Water Solubility Rates, as previously defined, as follows:

PVA—greater than 4 hrs, 44 min
PAA—½ dissolved in 4 hrs, 44 min
PVP, 40,000 AMW—2 hrs. 34 min
PVP, 300,000 AMW—80% dissolved in 4 hrs, 44 min
The solubility accelerator compounds had Water Solubility Rates as follows:

| | |
|---|---|
| Dextrose | 5 min |
| Potassium bromide | 1 min |
| Glycerol | 2 min |
| 1-Tartaric acid | 5 min |
| Citric acid | 6 min |
| Tetraethylene glycol | less than 1 min |
| Sorbitol | 6 min |
| Fructose | 11 min |
| Potassium chloride | 2 min |
| Sucrose | 12 min |

There has thus been described new undercoatings for the vacuum deposition of materials thereover that are rapidly removable from a substrate, by which is meant that the undercoatings and any vacuum deposited material adhering thereto can be washed from the substrate by washing with water for 1 minute or less. The new undercoatings comprise a water soluble film-forming polymer having a Water Solubility Rate in the range of 1 to 10 hours, a solubility accelerator consisting of a compound compatible with the polymer having a Water Solubility Rate of 30 minutes or less, and a solid particulate material insoluble in the film-forming polymer. The solid particulates provide a rough surface topology to a dried undercoating. The solubility accelerator speeds up the water removability of an undercoating made with the film-forming polymer, and the solid particulate further increases the rate of water removability, both ingredients thereby contributing to the production of an undercoating for vacuum deposition capable of meeting the objectives of this invention. While the proportions of these three ingredients in the undercoating does not appear critical, it has been found that, on a percent by weight basis, undercoatings with from 15 to 90% film-forming polymer, 5 to 80% solubility accelerator and 5 to 80% solid particulate material are particularly useful. Various materials can be vacuum deposited onto the undercoatings. The rapidly removable undercoatings greatly facilitate the manufacture of articles that include a substrate having a patterned vacuum deposited layer on at least one surface thereof. This is accomplished by enabling the manufacture of such articles in less time than is possible with prior art undercoatings, thereby allowing such articles to be produced at higher production rates than was previously attainable with the prior undercoatings. Furthermore, the new undercoatings are capable of yielding a patterned vacuum deposited layer having excellent resolution; this results in the present undercoatings being useful for the formation of patterned vacuum deposited layers having very fine or intricate details. Another important advantage is that the new undercoatings can be applied over printing inks and removed without damage to the inks, thus permitting the combination of vacuum deposited with printed graphics when required for a specific article. The undercoatings of this invention can be applied to any substrate material that can withstand the conditions of vacuum deposition, including for example, metal, wood, and plastic films and sheets of polymers such as polyesters, nylons, vinyls, acrylates, polycarbonates, fluorethylenes and polyimides.

Although this invention has been illustrated above by specific examples, it is expected that those of ordinary skill in the art will be able to devise modifications thereof that will be within the spirit and scope of this invention and it is intended that such modifications are to be encompassed by the appended claims.

I claim:

1. In the combination of a substrate, a patterned undercoating on a surface of the substrate, and a layer of vacuum deposited material over the patterned layer of undercoating,
    the improvement wherein the undercoating comprises a combination of the following ingredients:
    (1) a water soluble film-forming polymer consisting of a polymer having a Water Solubility Rate, measured as defined in the specification, in the range of 1 to 10 hours;
    (2) a solubility accelerator consisting of a compound compatible with the film-forming polymer and having a Water Solubility Rate, measured as defined in the specification, of 30 minutes or less; and
    (3) a solid particular material insoluble in the film-forming polymer and providing a rough surface topology to a dried layer of the undercoating;
    the undercoating and vacuum deposited material thereover characterized in being removable from the substrate by washing with water for one minute or less.

2. A combination according to claim 1, wherein:
    the film-forming polymer is polyvinyl alcohol, poly(acrylic acid) or polyvinyl pyrollidone, and has an average molecular weight of at least about 2,000.

3. A combination according to claim 1 or 2, wherein:
    the solubility accelerator is a sugar, salt, organic acid or organic alcohol, and has an average molecular weight of about 1,000 or less.

4. A combination according to claim 1 or 2, wherein:
    the solid particulate is aluminum powder, carbon black, silica, sodium potassium aluminum silicate, fine glass beads or $TiO_2$ coated mica.

5. A combination according to claim 3 wherein:
    the solid particulate is aluminum powder, carbon black, silica, sodium potassium aluminum silicate, fine glass beads or $TiO_2$ coated mica.

6. A method for producing a patterned layer of a material on a substrate including the steps of:
    (1) applying an undercoating on a surface of the substrate in a pattern including one or more first portions covered by the undercoating and one or more second portions of the surface free of the undercoating,
    the undercoating comprising, in combination, (a) a water soluble film-forming polymer consisting of a polymer having a Water Solubility Rate, measured as defined in the specification, in the range of 1 to 10 hours; (b) a solubility accelerator consisting of a compound compatible with the film-forming polymer and having a Water Solubility Rate, measured as defined in the specification, of 30 minutes or less; and (c) a solid particulate material insoluble in the film-forming polymer and providing a rough surface topology to a dried layer of the undercoating;
    (2) vacuum depositing a material over each first portion and each second portion of the surface of the substrate;
    (3) removing the undercoating and vacuum deposited material adhering thereto from each first portion of the surface of the substrate by washing with water for one minute or less,
    thereby providing the substrate with vacuum deposited material adhering to each second portion of the surface thereof.

7. A method according to claim 6, including the step of:
    including a film-forming polymer in the undercoating of polyvinyl alcohol, poly(acrylic acid) or polyvinyl pyrollidone that has an average molecular weight of at least about 2,000.

8. A method according to claim 6 or 7, including the step of:
    including a solubility accelerator in the undercoating of a sugar, salt, organic acid or organic alcohol, that has an average molecular of about 1,000 or less.

9. A method according to claim 6 or 7, including the step of:
    including a solid particulate in the undercoating of aluminum powder, carbon black, silica, sodium potassium aluminum silicate, fine glass beads or $TiO_2$ coated mica.

10. A method according to claim 8 including the step of:
    including a solid particulate in the undercoating of aluminum powder, carbon black, silica, sodium potassium aluminum silicate, fine glass beads or $TiO_2$ coated mica.

* * * * *

UNITED STATES PATENT AND TRADEMARK OFFICE
CERTIFICATE OF CORRECTION

PATENT NO. : 4,714,631
DATED : December 22, 1987
INVENTOR(S) : Brian E. Aufderheide It is certified that error appears in the above—identified patent and that said Letters Patent is hereby corrected as shown below:

Cancel claims 6, 7, 8, 9 and 10.

Signed and Sealed this

Eleventh Day of July, 1989

Attest:

DONALD J. QUIGG

Attesting Officer

Commissioner of Patents and Trademarks